United States Patent [19]

Ashmore, Jr.

[11] Patent Number: 5,734,275
[45] Date of Patent: Mar. 31, 1998

US005734275A

[54] PROGRAMMABLE LOGIC DEVICE HAVING A SENSE AMPLIFIER WITH VIRTUAL GROUND

[75] Inventor: Benjamin Howard Ashmore, Jr., Austin, Tex.

[73] Assignee: Advanced Micro Devices, Inc., Sunnyvale, Calif.

[21] Appl. No.: 683,685

[22] Filed: Jul. 18, 1996

[51] Int. Cl.$^6$ ........................................... G01R 19/00
[52] U.S. Cl. ............................................ 327/51; 327/50
[58] Field of Search ............................. 327/50, 51, 54, 327/57, 81, 427, 434, 560–563, 478; 365/205

[56] References Cited

U.S. PATENT DOCUMENTS

| | | | |
|---|---|---|---|
| 4,124,899 | 11/1978 | Birkner et al. | 364/716 |
| 4,899,070 | 2/1990 | Ou et al. | 307/530 |
| 4,918,341 | 4/1990 | Galbraith et al. | 327/51 |
| 5,410,268 | 4/1995 | Sharpe-Geisler | 327/51 |
| 5,426,385 | 6/1995 | Lai | 327/51 |
| 5,475,321 | 12/1995 | Aoyama et al. | 326/46 |
| 5,592,427 | 1/1997 | Kumakura et al. | 327/51 |
| 5,610,540 | 3/1997 | Althoff et al. | 327/51 |

*Primary Examiner*—Toan Tran
*Attorney, Agent, or Firm*—Conley, Rose & Tayon; Kevin L. Daffer

[57] ABSTRACT

A programmable logic device (PLD) is presented having an improved sense amplifier. The sense amplifier comprises a cascode-connected pair of transistors coupled between a sense amplifier output and a virtual ground. According to several embodiments, a clipping transistor and a current-channeling transistor can be provided with the sense amplifier to improve its operation. Further, additional current source and current sink transistors can also be added to the sense amplifier design. The clipping transistor helps ensure that any positive-going noise spikes do not deleteriously effect accurate readings of the true value on the input bit line. The current-channeling transistor helps prevent collapse of the bit line caused by significant conductivity of cells connected to the bit line. The combination of clipping and current-channeling provide a relatively narrow voltage range of the bit line voltage, resulting in fast recovery and high speed sensing thereof. The additional current source is used to impute additional current through the amplifying transistor of the cascode-coupled pair of transistors. The additional current sink transistor helps draw the current from the amplifying transistor to a ground supply. Only when the bit line voltage is high will the additional current source and current sink transistors be used.

60 Claims, 3 Drawing Sheets

PROGRAMMABLE LOGIC DEVICE HAVING A SENSE AMPLIFIER WITH VIRTUAL GROUND

BACKGROUND OF THE INVENTION

1. Field of the Invention

This invention relates to any device having a programmable bit line and more particularly to a sense amplifier for sensing the status of the bit line. The bit line can be programmed within, for example, a programmable logic device (PLD).

2. Description of the Relevant Art

A PLD is a general purpose combinational or sequential digital component whose ultimate function is determined by the designer. There are generally three classes of PLDs denoted as either a programmable gate array (PGA), a programmable logic array (PLA) and a programmable array logic (PAL).

A PGA comprises a matrix of cells spaced from one another by an interconnect network. Each cell can include one or more circuit devices, the function of which is defined by a metallization layer applied at the final stage of manufacture. Absent the programmable metallization layer, a PGA can be stockpiled to await a customer-defined program. The lower density cell layout and higher resistance interconnect is offset by the short design turnaround (i.e., program/functionality completion) time afforded by a PGA.

Unlike PGA, a PAL and PLA achieve programmability not at the metallization layer but mostly in the field. A PLA and PAL is generally programmed at the user site by selectively applying electrical "program" current and/or voltage to the PLA or PAL. The end user can thereby purchase the PLA or PAL and program (or reprogram) the device many times depending upon the desired application.

For sake of brevity, description of a conventional PLD is provided herein in reference to a PLA or PAL. It is understood, however, that the idea of a programmable array having a programmable bit-line output remains consistent for all PLDs regardless of whether the PLD is a PLA, a PAL or a PGA. Further, it is understood that the bit-line voltage state must be sensed in order to determine its programmed output. Each of the aforementioned PLDs must therefore need a sense amplifier which operates not only to sense a bit line state but to do so at high speeds with minimal power consumption.

A PLA and a PAL comprise an array of AND and OR logic gates that can be organized from dedicated logic functions by selectively opening or otherwise altering the interconnections between the gates. Alterations can be accomplished by blowing fusible links or reducing the conductivity of the interconnections by selectively applying a programmable voltage and/or current.

In a PLA or PAL, alterations are performed on the array—the AND array and/or the OR array. A PLA comprises both an AND array and an OR array. A typical PLA device 10 is shown in FIG. 1. Sense amplifiers 12 and 14 are coupled at the output of respective AND and OR arrays 16 and 18. Sense amplifier 12 not only senses but also amplifies the voltage value upon bit lines (BL) 18 which extend from AND array 16. The amplified signal is then applied to word lines (WL) 20 of OR array 18. The OR array, and specifically the bit lines 22 of OR array 18, is responsive to the logic value of word lines 20.

The programmable interconnections of AND array 16 and OR array 18 include not only fuses but also programmable transistors, such as floating-gate MOSFETs and RAM cells. Upon receiving a programmable voltage on their word lines, AND array 16 or OR array 18 respond by making certain interconnections (i.e., programming the array). The word lines associated with AND array 16 are labeled as reference numeral 24. Using a floating-gate MOSFET example, word lines are coupled to the floating-gate of the MOSFET, and bit lines are connected to the drain terminal of the MOSFET. The source terminal is typically connected to a ground supply.

While a PLA includes both AND and OR arrays, a PAL includes only an AND array. The OR array of a PAL is not needed since the sharing of AND outputs ("products") between outputs is not used. A PAL is therefore no longer universal since a fixed allocation of products to OR gate must be chosen.

Regardless of whether the structure includes both an AND array and an OR array, or only an AND array, the structure can replicate any combinational logic using a sum of products (SOP) output. Accordingly, SOP output is shown as reference numeral 26 in FIG. 1. The SOP output can, if desired, be extended by adding clocked flip-flops within a sequential circuit 28. The sequential circuit receives SOP output 26 to create a general-purpose sequencer. A sequencer such as that shown in FIG. 1 allows direct implementation of a synchronous finite state machine with both Moore-type or Mealy-type outputs. The transitions between states in the behavioral specification in the state machine map directly into the product terms of the sequencer. Output from sequential circuit 28, denoted as reference numeral 30, can be fed back either to AND array 16 or OR array 18 depending upon the level of programmability needed.

FIG. 2 illustrates in further detail AND array 16, sense amplifier 12, OR array 18 and sense amplifier 14. AND array 16 receives a series of word line (WL) inputs, both true and complement word line values. Word lines extend as rows across AND array 16 and intersect bit lines (BLs) which extend as columns. A cell 32 is formed at the intersection between word lines and bit lines.

During operation, a high value upon word lines will cause a corresponding cell 32 to form a low resistive path between a ground supply and a corresponding bit lines. Thus, a bit line will go to a low logic value if a single cell 32 along that bit line column is conducting. Conversely, a bit line will transition to a high logic value if all the cells 32 along the bit line are non-conducting. A "programmed" cell 32, according to the present example, is one which will conduct if its associated word line voltage value is high. The operation of cells 34 within OR array 18 can operate in the same fashion as cells 32 within AND array 16.

The difference between high and low logic values on associated bit lines is generally quite small. There is a need to discern that difference and to amplify that difference to a voltage value recognizable to combinational or sequential logic. That need is filled by sense amplifiers 12 and 14 coupled between bit lines and logic devices 36 and 38, respectively. AND array 16 and sense amplifier 12 thereby comprise the combination of cells 32 arranged within a matrix, the output of which is sensed and amplified as input to a series of AND gates 36. Likewise, OR array 18 and sense amplifier 14 form the combination of cells 34 having an output which is sensed and amplified as input to a series of AND gates 38. As defined henceforth, a conducting cell is one which presents a low logic value on its associated bit line. The low logic value is one which is distinguished from a high logic value by the corresponding sense amplifiers 12 or 14.

Referring to FIG. 3, a detailed schematic of an interconnection between a programmable cell and a sense amplifier is illustrated. In the example shown, programmable cells 32a/34a and 32b/34b comprise two programmable read-only memory (PROM) cells useable in either art AND array or an OR array. Cells associated with a single bit line are connected in parallel between that bit line and a ground supply 40. A true and complement word line is forwarded to the cells to activate either a conductive or non-conductive path between the interconnected bit line and ground supply 40. A BIAS transistor 42 includes a source/drain path connected between the bit line and sense amplifier 12/14. The source/drain path is controlled by a BIAS voltage applied to the gate terminal of transistor 42. Typically, BIAS voltage applied to BIAS transistor 42 is constant, and is selected to ensure a constant current source into sense amplifier 12/14. Coupled to the output of sense amplifier 12/14 is typically a buffer 44, the output of which is fed into logic gates. The logic gates can comprise either a series of AND gates or a series of OR gates, depending on whether the cell at issue is within an AND array or an OR array.

Sense amplifiers coupled to the output of AND or OR arrays are fairly well known. A description of a PLD having the aforesaid architecture is provided in reference to U.S. Pat. No. 5,475,321 (herein incorporated by reference). AND and OR arrays associated with modern PLDs are quite large. Specifically, there can be hundreds if not thousands of connections to each bit line. Those connections attribute parasitic capacitance to the bit line which can lessen the responsiveness of the sense amplifier output to transitions of the cells. For example, if most of the cells associated with a bit line are conducting, the associated bit line cannot quickly transition to a high logic value when all of those cells transition to a non-conducting state. Likewise, when the cells are all non-conducting, it may take some time before the associated bit line can transition to a low state if only a few cells become conducting. Thus, the bit line is slew rate sensitive, and has a transition delay proportional to the loading factor of numerous cells coupled thereto. These problems are generally described in reference to U.S. Pat. No. 5,410,268 (herein incorporated by reference).

It is important to maintain large matrices of cells while at the same time minimizing the transition delay associated with those large matrices. It would be desirable for the sense amplifier to sense slight changes in bit line voltages thereby enhancing the speed of the sense operation. However, sensing must be performed with minimal account given to improper transitions or noise upon the bit line. Even in worst case situations where numerous cells are transitioning from a conductive to a non-conductive state, the resulting noise level must not deleteriously effect the true bit line value. More specifically, noise under the worst case scenarios must not cause improper transitions of the sense amplifier. It is therefore desirable that a sense amplifier be designed which is not unduly susceptible to situations where numerous transitions cause imputed noise on the bit line. Given minimal effect of bit line noise on the sense amplifier, the sense amplifier must nonetheless be able to read small, actual (non-noise) voltage fluctuations in the bit line signal. Still further, the desired sense amplifier must not itself impute noise onto the power supply or ground supply conductors attached thereto. An improved sense amplifier is therefore needed which can sense small voltage differences on the bit line at a relatively high rate, can consume minimal power, and can place minimal noise on the power and ground supply conductors.

SUMMARY OF THE INVENTION

The problems outlined above are in large part solved by an improved sense amplifier of the present invention. The sense amplifier utilizes a cascode arrangement of transistors connected to each bit line forwarded from a programmable array of cells. The cells are those found in any PLD: either a PGA, a PLA or a PAL. The cascode-connected transistors include a source/drain path through which current from a current source transistor forwards current from a power supply to a current sink transistor. The amount of current being forwarded is dependent upon the size of transistors which form the current supply and current sink. A current sinking, single BIAS N transistor is coupled between the cascode-connected transistors and a ground supply. A pair of current sourcing, parallel-coupled BIAS P transistors are coupled between a power supply and the cascode-connected transistors. The single BIAS N transistor receives a BIAS voltage sufficient to sink current through the cascode transistors from the pair of BIAS P transistors coupled to the power supply. Thus, the pair of BIAS P transistors are configured to receive a BIAS voltage sufficient to source a current equal to the current which the single BIAS N transistor sinks.

The cascode-coupled transistors comprise an amplifying transistor having a gate connected to receive a bit line. The amplifying transistor includes a source/drain path coupled between the parallel-coupled pair of BIAS P transistors and the single BIAS N transistor. Thus, the source/drain path of the amplifying transistor does not connect directly to a ground supply as in conventional designs. Instead, the source/drain path couples to a virtual ground which is regulated to the ground supply by the single BIAS N transistor. The purpose in having a single BIAS N transistor coupled between the ground supply and the bit line ground is to prevent collapse of the bit line and to ensure fast sense operation thereof.

In addition to an amplifying transistor, the cascode-connected transistors also include a pull-up transistor having a gate terminal connected to the source/drain path of the amplifying transistor, and further having a source/drain path connected between the bit line and the sense amplifier output. The amplifying transistor serves to amplify the sense amplifier output relative to the bit line, whereas the pull-up transistor attempts to drive the bit line high when one or more cells connected to the bit line are conducting. When cells are conducting, the bit line is driven low by the direct source/drain path within each cell, causing the amplifying transistor source/drain path to be of large resistive value. The gate terminal of the pull-up transistor is therefore drawn to a high voltage value as a result of a BIAS P transistors pulling the pull-up transistor gate high. An active high on the pull-up transistor gate somewhat counteracts the pull-down effect of conductive cells, and thereby prevents collapse of the bit line toward ground supply. As such, the improved cascode and BIAS P transistor arrangement hereof helps ensure the bit line logic values are approximately near the threshold value of the amplifying transistor. Any slight modification (except for noise) on the bit line voltage will be quickly sensed by the amplifying transistor, the result of which is placed on the sense amplifier output.

According to one embodiment, a diode-configured transistor is coupled between the amplifying transistor source/drain path and the pull-up transistor source/drain path. The diode-coupled transistor is configured having the gate and drain terminals mutually connected to the source/drain path of the amplifying transistor. The source terminal of the diode-coupled transistor is connected to the source/drain path of the pull-up transistor. The diode-coupled transistor serves to channel current from one of the pair of BIAS P transistors to the pull-up transistor source/drain path during times when cells on the bit line are conductive. The diode-coupled transistor is therefore referred to as a "current channeling transistor" which provides current from the pair of BIAS P transistors to the ground supply during times when the cells are conductive. That current substantially equals the current forwarded through the amplifying transistor source/drain path during times when the cells are non-conductive. The current channeling transistor helps ensure against collapse of the bit line to ground when the cells are conducting.

According to another embodiment, an additional current source is provided from the power supply to the source/drain path of the amplifying transistor. The additional current supply is sourced into the amplifying transistor source/drain path which equals the current normally sourced by one of the pair of BIAS P transistors. Utilizing a current channeling transistor causes decoupling of current from one of the pair of BIAS P transistors such that the current must be replicated by current from the additional current source. While the current channeling transistor ensures fairly uniform current from the pair of BIAS P transistors through the pull-up transistors during low bit line conditions, the additional current source (in addition to one of the pair of BIAS transistors) replicates that current through the amplifying transistor during high bit line conditions. Thus, the combination of current steering and additional current sourcing advantageously provides uniform current between the power and ground supplies regardless of the bit line voltage state. Accordingly, current channeling and additional current sourcing maintains substantially uniform power consumption with minimal noise imputed upon the power supplies regardless of the condition being sensed.

According to yet another embodiment, a clipping diode is coupled between the bit line and the virtual ground conductor. The clipping diode comprises a mutually coupled drain and gate terminal of a transistor connected to the bit line, wherein the source of that transistor is connected to a virtual ground conductor. The virtual ground conductor is separated from the ground supply by a single BIAS N transistor, and more specifically a source/drain path of that transistor. Single BIAS N transistor is an n-channel transistor, whereas the pair of BIAS P transistors are p-channel transistors. The clipping diode is used to remove over-voltage noise spikes from the bit line which exceed the threshold of the diode. Noise spikes often occur when a large number of conductive cells transition from a conductive state to a non-conductive state. If a single cell remains conductive, then the bit line must remain low; however, transitioning of a large number of cells to a non-conducting state inadvertently causes a temporary voltage rise on the bit line. Unless that voltage rise is clipped (removed) by the clipping diode, the bit line-imputed noise will translate to a false high voltage read by the sense amplifier. The clipping diode also serves to maintain the bit line voltage near an optimal voltage sense range. By preventing bit line voltage rise above a predetermined amount, the clipping diode maintains the bit line voltage near an amount which ensures fast recovery (and therefore fast subsequent sense times) from large voltage spikes on the bit line.

According to still another embodiment, a pull-down transistor is coupled between the virtual ground (bit line ground) and the ground supply. The pull-down transistor includes a gate terminal connected to the output of a sense amplifier. During times when the sense amplifier output is high (denoting a high bit line) it is necessary to ensure sufficient sinking current from the active amplifying transistor. More specifically, whenever the bit line is high, or above the threshold of the amplifying transistor, the amplifying transistor turns on, and the source of that transistor sinks current from at least one of the pair of BIAS P transistors, and possibly from the additional current supply. There may be a significant amount of current needed to be drawn away from the BIAS transistors by the source of the amplifying transistor, that result being achieved by adding another sinking transistor (pull-down transistor) to the amplifying transistor source-coupled virtual ground. The added ground afforded by the pull-down transistor allows significant amounts of current to be drawn to the amplifying transistor only during times when the bit line is high. If the bit line transitions low, then not only will the amplifying transistor turn off but so will the pull-down transistor. Hard coupling the ground supply to the virtual ground in the later instance is not needed. Accordingly, the pull-down transistor is selectively coupled to the virtual ground depending upon the voltage state of the sense amplifier output.

BRIEF DESCRIPTION OF THE DRAWINGS

Other objects and advantages of the invention will become apparent upon reading the following detailed description and upon reference to the accompanying drawings in which.

Figure 1:
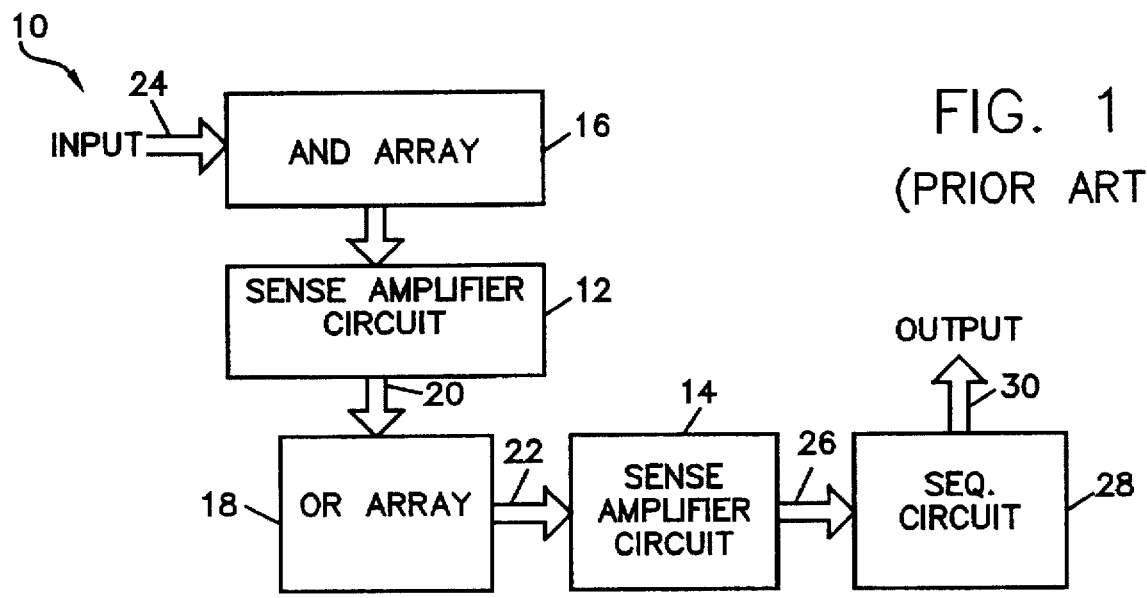
FIG. 1 is a block diagram of a PLD, and more specifically a PLA having an AND array and an OR array.
Figure 2:
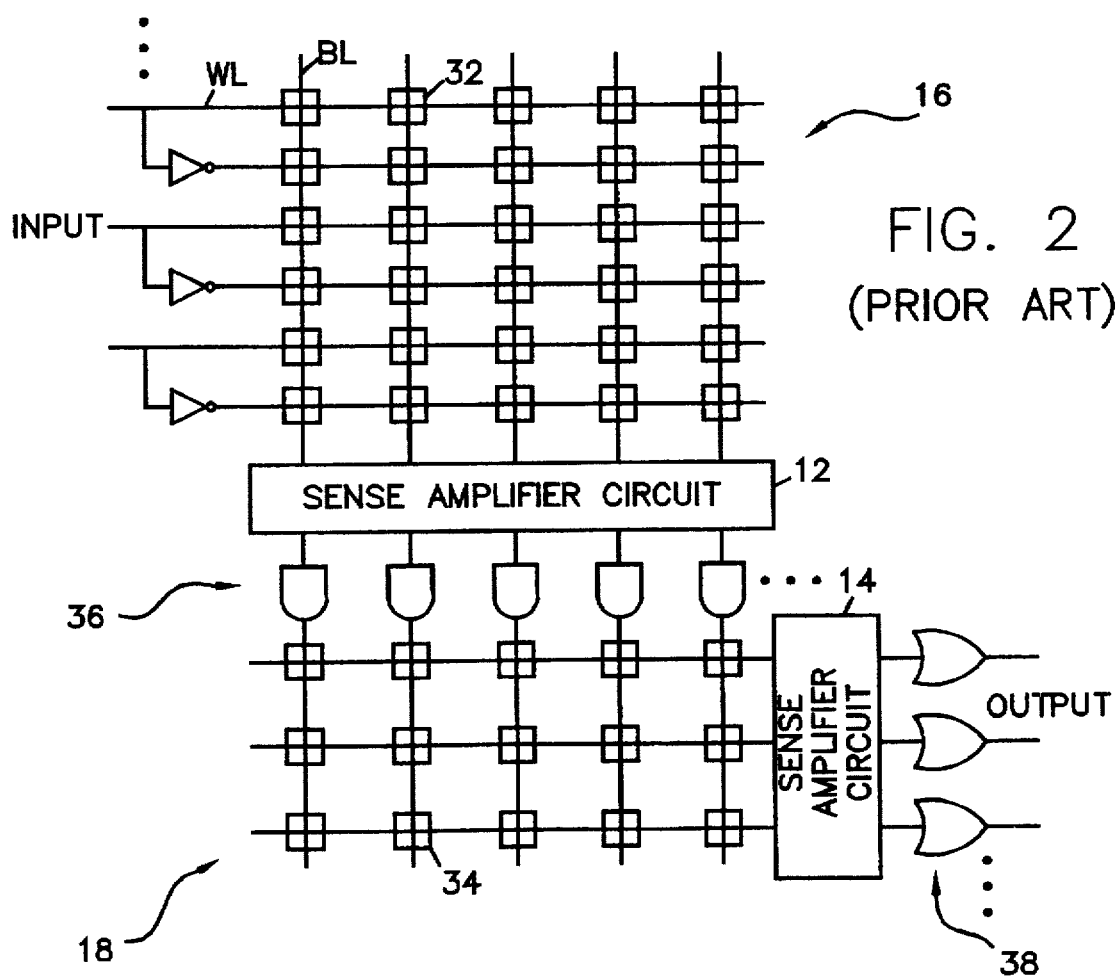
FIG. 2 is a logic diagram of AND/OR array cells with sense amplified output according to the block diagram of FIG. 1.
Figure 3:
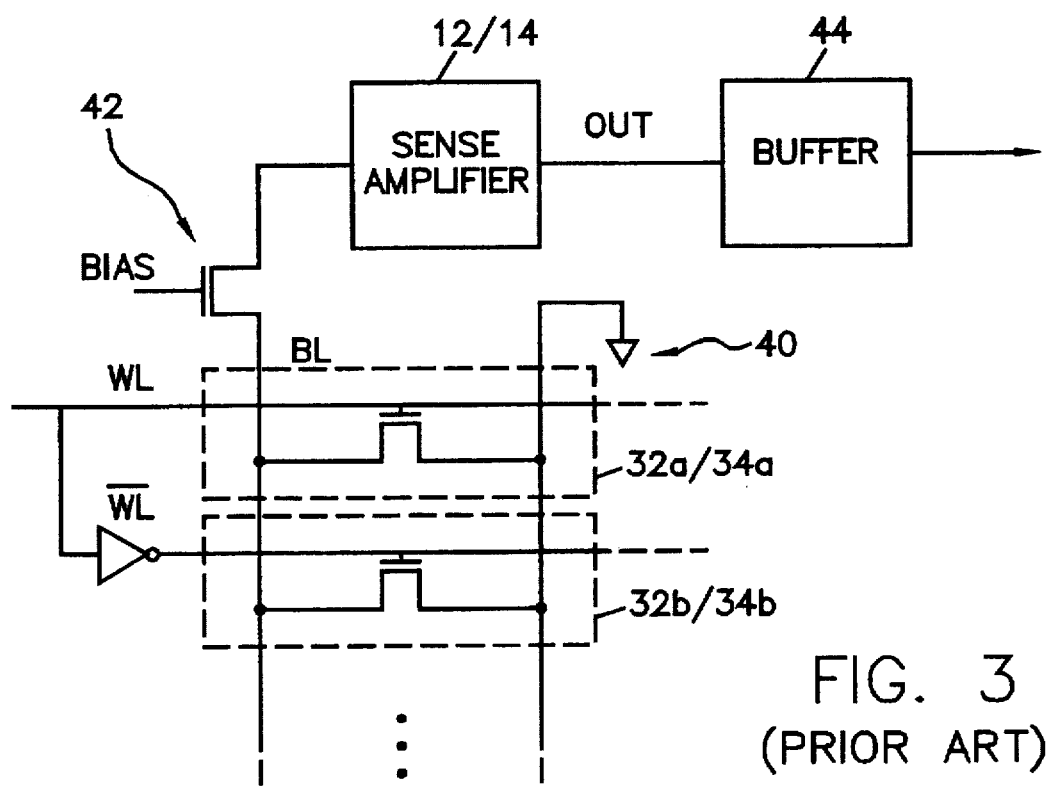
FIG. 3 is a circuit schematic of AND/OR array cells coupled to a sense amplifier according to a conventional design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
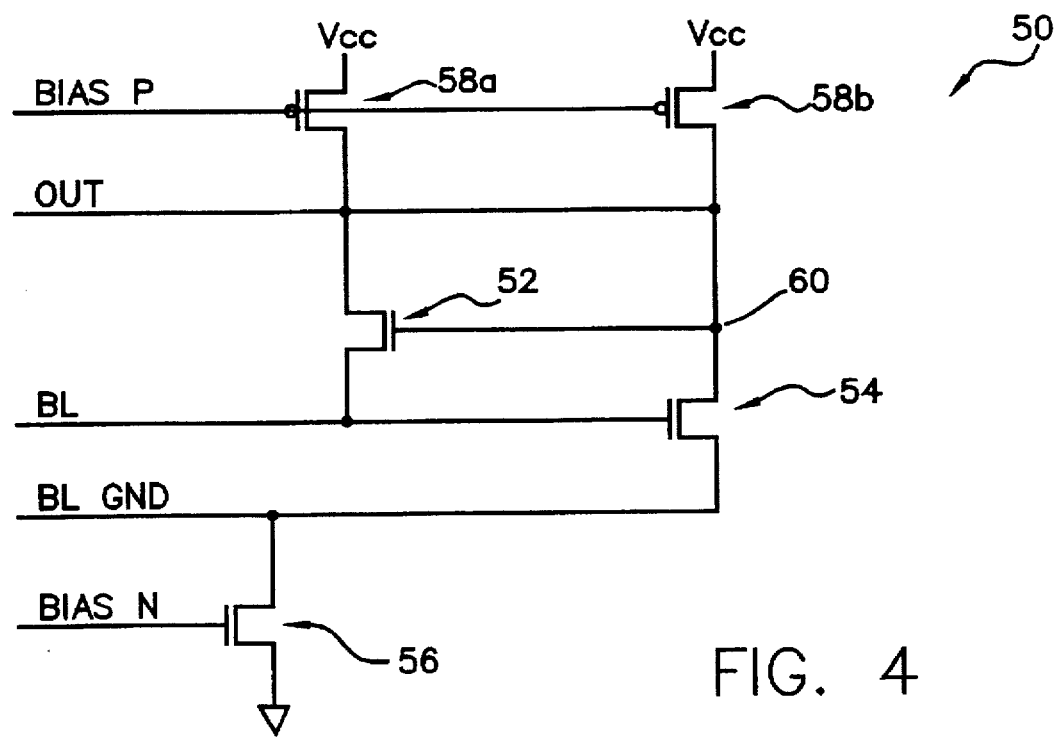
FIG. 4 is a circuit schematic of a sense amplifier according to one embodiment of the present invention.

Turning now to FIG. 4, a circuit schematic of one embodiment of a sense amplifier is shown according to the present invention. Sense amplifier 50 comprises a cascode arrangement of a pull-up transistor 52 and an amplifying transistor 54. Transistors 52 and 54 are preferably n-channel MOS transistors. The gate terminal of pull-up transistor 52 is connected to the source/drain path (specifically, the drain terminal) of amplifying transistor 54. The source/drain path (specifically, the source terminal) of transistor 52 is connected to the bit line as well as the gate terminal of transistor 54. Accordingly, the mutual connections between transistors 52 and 54 comprise a cascode connection coupled between an output of sense amplifier 50 (OUT) and the bit line (BL).

The virtual ground is driven to a ground supply 56 in accordance with a BIAS N voltage applied to an BIAS N transistor 56. BIAS N transistor 56 sinks current through amplifying transistor 54 during times in which a bit line voltage exceeds a turn-on threshold of transistor 54. BIAS N voltage is selected to draw a specified amount of current in accordance with the geometry of BIAS N transistor 56, and more specifically a geometry of BIAS P transistor pairs 58a and 58b as well as BIAS P voltage applied thereto. If bit line goes low (less than the threshold of amplifying transistor 54), node 60 will be drawn to a high voltage value which causes turn-on of pull-up transistor 52. However, if cells coupled to the bit line remain conducting, pull-up transistor will not pull up the bit line to a threshold above the turn on of amplifying transistor 54. Instead, pull-up transistor 52 merely prevents collapse of bit line voltage to the ground supply. Pull-up transistor 52 thereby maintains bit line voltage approximately near the threshold of amplifying transistor 54 in readiness for bit line transition to a high level. The bit line transitions to a high level whenever the cells are no longer conducting, and pull-up transistor 52 moves the bit line voltage above the threshold of amplifying transistor 54. Once transistor is turned on (i.e., placed in the linear or saturation region), a drop in the voltage at node 60 occurs and pull-up transistor 52 turns off. In the instance in which bit line is low, pull-up transistor 52 is active and sense amplifier output (OUT) is also low. However, in instances where bit line is high, then pull-up transistor 52 is inactive and the sense amplifier output is high. Accordingly, output (OUT) follows the bit line (BL) logic state, yet at an amplified voltage level.

An important aspect of sense amplifier 50 is BIAS N transistor 56 as well as the direct connection of amplifying transistor 54 to transistor 56. Instead of connecting amplifier transistor 54 directly to a ground supply, as in conventional designs, amplifying transistor 54 is connected to a virtual ground (BL GND). The virtual ground is regulated by BIAS N voltage applied to BIAS N transistor 56. BIAS N voltage is chosen to sink sufficient current through amplifying transistor 54 during times in which the bit line is high and transistors 58a and 58b are sourcing current through amplifying transistor 54. The gain of BIAS N transistor 56 is specifically chosen to be greater than the gain of BIAS P transistor 58a but less than the cumulative gain of transistors 58a and 58b. Proper sizings of those transistors to achieve the desired gain helps ensure that any active memory element (conductive cell) can initiate a sense condition by pulling the bit line low, or any inactive memory elements can terminate a sense condition by pulling the bit line high. These advantages are provided by careful attention to BIAS voltages (BIAS N and BIAS P) as well as the sizings of transistors 56, 58a and 58b. The input BIAS levels BIAS P and BIAS N are chosen such that p-channel and n-channel devices, respectively, of identical gain will source and supply, respectively, identical currents. Careful attention to the sizing ratios, and gain provided by those ratios, is necessary to ensure proper operation of the bit line approximately near the threshold of transistor 54. Proper sizings and gain of the BIAS transistors thereby enhances the speed by which sense amplifier 50 operates.

Figure 5:
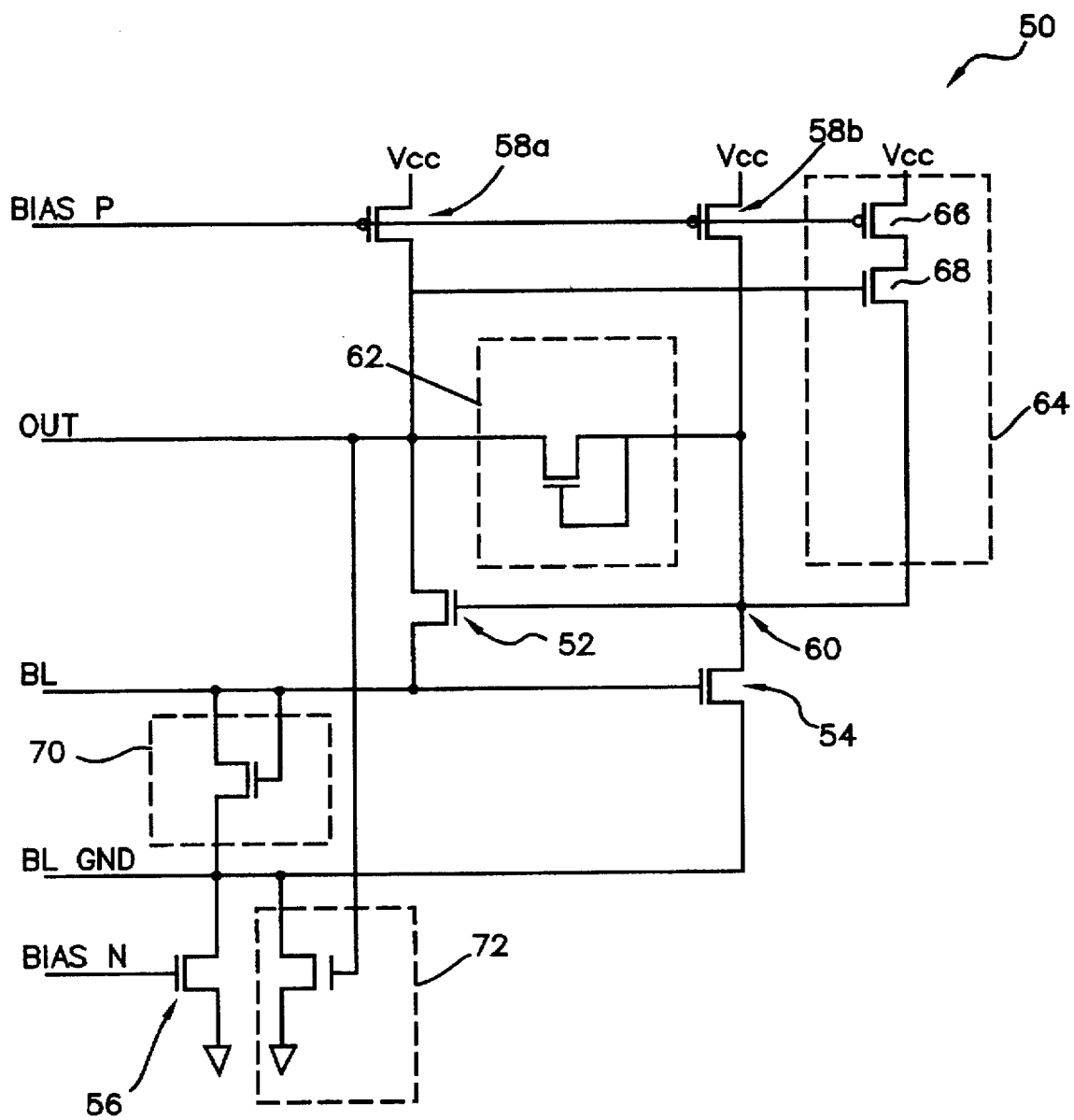
FIG. 5 is a circuit schematic of a sense amplifier according to various alternative embodiments of the present invention.

Turning now to FIG. 5, various embodiments are provided to the base sense amplifier 50 shown in FIG. 4. The embodiments are provided either in the alternative to one another, or cumulative of each other. Each embodiment is shown in FIG. 5 encircled by a phantom line, and will be discussed henceforth in regard to their unique features.

FIG. 5 illustrates sense amplifier 50 having cascode transistors 52 and 54 as well as BIAS transistors 56, 58a and 58b, similar to those shown in FIG. 4. In addition to the base arrangement of FIG. 4, a current channeling transistor 62 shown in FIG. 5 may be added according to one embodiment. Transistor 62 is essentially configured as a diode having the gate and drain terminals of transistor 62 coupled together to node 60. The source of transistor 62 is connected to the output terminal of sense amplifier 50.

Current channeling transistor 62 performs an important function in that it channels current sent from transistor 58b through transistor 52, and eventually through the conducting transistors of various cells connected to the bit line. Thus, during times when the bit line is low, node 60 is drawn to a high voltage level via transistor 58b, and current flows through current channeling transistor 62. When the bit line is low, a substantial majority of current will be sourced from transistor 58b and transistor 58a. Conversely, when the bit line is high, transistor 54 will turn on and node 60 will drop. A lowering of node 60 will reverse BIAS the diode of current channeling transistor 62 causing the entirety of current flowing through transistor 54 to arise from transistor 58b. Current channeling transistor 62 helps reduce negative voltage swings upon the bit line.

To further aid in maintaining constant current, particularly during times when the bit line is high, an additional current source 64 is provided according to another embodiment. Additional current source 64 preferably provides the current which transistor 58a would normally provide, absent transistor 62. However, since transistor 62 blocks passage of current from transistor 58a during a low voltage at node 60, all current through transistor 54 arises from transistor 58b and, if provided, additional current source 64. Current source 64 comprises a series-connected pair of p-channel and n-channel transistors 66 and 68, respectively. Transistors 66 and 68 are sized to compensate for the loss of current from transistor 58a only during times when node 60 is low. If node 60 is high, then current through transistor 52 will arise from transistors 58a and 58b. Additional current source 64 thereby equalizes the current through amplifying transistor 54 to that of the current through pull-up transistor 52, and thereby draws substantially equal current from the power supply to the ground supply regardless of the bit line voltage state. If not for current channeling transistor 62 connected as a diode, additional current source 64 would not be needed. However, the advantages of the current channeling transistor is needed, and is enhanced by additional current source 64. The combination of transistor 62 and source 64 help ensure, regardless of the bit line state, a constant current through either transistor 52 or (if the bit line is low) transistor 54 (if the bit line is high). A constant current through transistors 52 and 52, regardless of the bit line state, helps ensure a constant draw of current from the power supply and thereby lessens the imputed noise upon that supply. Further, a constant current draw from the power supply substantially eliminates power consumption spikes regardless of the bit line state or transitions of the bit line.

According to yet another embodiment, a clipping transistor 70 is provided. Clipping transistor 70 is configured as a diode, wherein the gate and drain terminals are connected together to the bit line, and the source terminal is connected to the virtual ground. Clipping transistor 70 serves to clip any rising voltage upon the bit line. If the rising voltage of transistor 54 exceeds the forward bias threshold of the diode-coupled transistor 70, then transistor 54 becomes active and the rising voltage is clipped to a pre-defined level. Clipping transistor 70 thereby serves to perform the clipping operation during times when a false rise (resulting from noise) is placed upon the bit line. A false rise generally occurs in large PLDs which have numerous cells within an array. If numerous cells connected to a bit line are in a conductive state, the bit line will be drawn substantially close to ground. However, pull-up transistor 52 helps ensure that the bit line does not collapse fully to ground. Pull-up transistor thereby serves to maintain the bit line near the threshold voltage of transistor 54 so that when the bit line goes high, transistor 54 output quickly transitions high.

Clipping transistor 70 helps reduce the bit line recovery time from overvoltage conditions, whereas the current channeling transistor 62 helps reduce bit line recoery time from undervoltage conditions. Thus, the combination of transistors 62 and 70 ensures a narrow range of voltages upon the bit line, resulting in high speed sensing thereof.

The bit line can be adversely affected if, for example, numerous cells are conducting and all but one cell transitions to a non-conducting state. As many cells become non-conducting, pull-up transistor 54 temporarily drives the bit line high. The pull-up transistor is sized so that significant drive is provided, so that a temporary rise in the bit line voltage occurs during this transitional moment. The aforesaid bit-line-rise problem occurs due to the needed drive strength of pull-up transistor 52. To partially overcome this problem, clipping transistor 70 is presented. In addition, the cascode arrangement of transistors 52 and 54 assures that node 60 fluctuates significantly more than the bit line. Fluctuation margin maintained by the cascode arrangement helps prevent inadvertent transitions of pull-up transistor 52. Thus, small transitions upon transistor 54 gate will not necessarily equate to turn-off conditions at node 60 relative to pull-up transistor 52. Thus, the cascode-configured transistors, in conjunction with clipping transistor 70, is less sensitive to bit-line-rise noise common in large PLDs.

According to another embodiment, an additional pull-down transistor 72 is provided. Pull-down transistor is coupled in parallel with BIAS N transistor 56. Pull-down transistor 72 is active only during when the output (OUT) of the sense amplifier is high. Thus, like BIAS N transistor 56, pull-down transistor 72 is an n-channel transistor.

Pull-down transistor 52 is operably coupled to draw current from the virtual ground only when the sense amplifier output is high. Current is purposefully not drawn from the virtual ground when the output is low. Whenever the bit line transitions high, transistor 54 will turn on and the sense amplifier output will transition high. If the bit line is high, then a need arises for securely coupling the virtual ground to the ground supply. This need is fulfilled by providing an additional pull-down transistor 72 coupled in parallel to BIAS N transistor 56. The additional pull-down ensures the virtual ground is substantially near ground supply and that sufficient current can be drawn through transistor 54. The pull-down transistor 72 (or additional sink transistor) is active only when there is a need to couple a virtual ground near the ground supply. This occurs only when the sense amplifier output is high. When the sense amplifier output is low (i.e., as a result of the bit line being low), then a coupling of the virtual ground to the ground supply is not needed. This is evidenced by the sense amplifier output being low, thereby rendering transistor 72 off.

It will be appreciated to those skilled in the art having the benefit of this disclosure that this invention is believed to be capable of use with any PLD. Furthermore, it is also to be understood that the form of the invention shown and described is to be taken as exemplary, presently preferred embodiments of a sense amplifier embodied upon a PLD. Various modifications and changes may be made without departing from the spirit and scope of the invention as set forth in the claims. It is intended that the following claims be interpreted to embrace all such modifications and changes.

What is claimed is:

1. A programmable logic device, comprising:
   an array of programmable interconnect devices arranged in a plurality of rows and columns;
   plurality of word lines connected to a respective one of said plurality of programmable interconnect devices arranged within one of the plurality of columns;
   a bit line and a ground supply coupled across said plurality of programmable interconnect devices arranged within said one of plurality of columns;
   an amplifying transistor having a first gate, a first source and a first drain, wherein the first gate is coupled to receive the bit line;
   a pull-up transistor having a second gate, a second source and a second drain, wherein the second gate is coupled to the first drain and wherein the second source is coupled to the first gate;
   a first bias transistor coupled between said first source and said ground supply for drawing current from said first source to said ground supply; and
   an output coupled to the second drain, wherein the output is configured to receive an output voltage which is amplified relative to a voltage upon said bit line.

2. The programmable logic device as recited in claim 1, wherein said programmable interconnect devices comprise transistors.

3. The programmable logic device as recited in claim 2, wherein said plurality of word lines are coupled to a gate of said transistors.

4. The programmable logic device as recited in claim 2, wherein said transistors are electrically programmable.

5. The programmable logic device as recited in claim 1, wherein a signal upon said bit line is responsive to a signal upon said word lines.

6. The programmable logic device as recited in claim 1, wherein said first bias transistor is responsive to a first reference voltage placed upon a gate of the first bias transistor.

7. The programmable logic device as recited in claim 1, further comprising a second and third bias transistors coupled in parallel between said second drain and a power supply for sourcing current from said power supply to said second drain.

8. The programmable logic device as recited in claim 7, wherein said second and third bias transistors are each responsive to a second reference voltage placed upon a gate of the second and third bias transistors.

9. A sense amplifier, comprising:
   a bit line responsive to at least one programmable device connected thereto;
   a first bias transistor coupled between a ground supply and a bit line ground conductor;
   a second bias transistor coupled between a power supply and an output conductor;
   an amplifying transistor having a first gate, a first source and a first drain, wherein the first gate is coupled to the bit line and the first source is coupled to the bit line ground conductor;
   a pull-up transistor having a second gate, a second source and a second drain; wherein the second gate is coupled to the first drain, the second source is coupled to the first gate and the second drain is coupled to the output conductor; and an output voltage applied to the output conductor which is amplified relative to a logic value upon said bit line.

10. The sense amplifier as recited in claim 9, wherein said output voltage is pulled up to approximately said power supply during times when the logic value upon said bit line is at a relatively high value.

11. The sense amplifier as recited in claim 10, wherein said relatively high value comprises a voltage magnitude exceeding a turn-on threshold of said amplifying transistor.

12. The sense amplifier as recited in claim 9, wherein said output voltage is pulled down via pull-down transistors coupled to the bit line to approximately said ground supply during times when the logic value upon said bit line is at a relatively low value.

13. The sense amplifier as recited in claim 12, wherein said relatively low value comprises a voltage magnitude less than a turn-on threshold of said amplifying transistor.

14. A programmable logic device, comprising;
- an array of programmable interconnect devices arranged in a plurality of rows and columns;
- a plurality of word lines connected to a respective one of said plurality of programmable interconnect devices arranged within one of the plurality of columns;
- a bit line coupled to said plurality of programmable interconnect devices arranged within said one of the plurality of columns;
- an amplifying transistor having a first gate, a first source and a first drain, wherein the first gate is coupled to receive the bit line;
- a pull-up transistor having a second gate, a second source and a second drain, wherein the second gate is coupled to the first drain and wherein the second source is coupled to the first gate;
- an output conductor coupled to the second drain to receive an output voltage amplified relative to a voltage upon said bit line; and
- a clipping diode connected between said bit line and a conductor which is selectively coupled to a ground supply, wherein said clipping diode clips said voltage upon said bit line to said ground supply if said voltage upon said bit line exceeds a forward bias threshold of said clipping diode and said output voltage exceeds a predetermined amount.

15. The programmable logic device as recited in claim 14, further comprising a current sourcing pair of transistors connected in series between a power supply and said first drain for supplying current to the first drain during times when the voltage upon the bit line is greater than a threshold voltage of said amplifying transistor.

16. The programmable logic device as recited in claim 14, further comprising a first bias transistor coupled between said first source and said ground supply for drawing current from said first source to said ground supply.

17. The programmable logic device as recited in claim 14, wherein said programmable interconnect devices comprise transistors.

18. The programmable logic device as recited in claim 17, wherein said plurality of word lines are coupled to a gate of said transistor.

19. The programmable logic device as recited in claim 17, wherein said transistors are electrically programmable.

20. The programmable logic device as recited in claim 14, wherein a signal upon said bit line is responsive to a logic state upon said word lines.

21. The programmable logic device as recited in claim 16, wherein said first bias transistor is responsive to a first reference voltage placed upon a gate of the first bias transistor.

22. The programmable logic device as recited in claim 14, further comprising a current channeling transistor having a third gate, a third source and a third drain, wherein the third gate and third drain are mutually connected to said first drain, and wherein the third source is connected to said second drain.

23. The programmable logic device as recited in claim 14, further comprising means for directing a first supply of current through said pull-up transistor during a time period when voltage upon said bit line is less than a threshold voltage of said amplifying transistor and means for directing a second supply of current through said amplifying transistor during a time period when voltage upon said bit line is greater than a threshold voltage of said amplifying transistor, and wherein said first supply of current is substantially equal to said second supply of current.

24. The programmable logic device as recited in claim 14, wherein said conductor is configured to receive a virtual ground.

25. The programmable logic device as recited in claim 14, further comprising a pull-down transistor having a source and drain path coupled between said conductor and said ground supply, said pull-down transistor further having a gate coupled to the output conductor responsive to said output voltage for connecting said conductor to said ground supply.

26. A sense amplifier, comprising:
- bit line responsive to at least one programmable device connected thereto;
- an amplifying transistor having a first gate, a first source and a first drain, wherein the first gate is coupled to the bit line;
- a pull-up transistor having a sound gate, a second source and a second drain, wherein the second gate is coupled to the first drain, the second source is coupled to the first gate, and the second drain is coupled to an output conductor;
- an output voltage applied to the output conductor which is amplified relative to a voltage upon said bit line; and
- clipping diode coupled between said bit line and a virtual ground that is selectively coupled to a ground supply depending upon said output voltage.

27. The sense amplifier as recited in claim 26, further comprising a current channeling transistor having a third gate, a third source and a third drain, and said third gate and said third drain are mutually connected to said first drain, and said third source is connected to said second drain.

28. The sense amplifier as recited in claim 26, wherein said clipping diode comprises a transistor having a gate and drain mutually connected to said bit line.

29. The sense amplifier as recited in claim 26, further comprising a pull-down transistor having a source and drain path coupled between said virtual ground and said ground supply, said pull-down transistor further having a gate coupled to the output conductor in response to the output voltage.

30. A programmable logic device, comprising:
- an array of programmable interconnect devices arranged in a plurality of rows and columns;
- a plurality of word lines connected to a respective one of said plurality of programmable interconnect devices arranged within one of the plurality of columns;
- a bit line coupled to said plurality of programmable interconnect devices arranged within one of said plurality of columns;
- an amplifying transistor having a first gate, a first source and a first drain, wherein the first gate is coupled to receive the bit line;

a pull-up transistor having a second gate, a second source and a second drain, wherein the second gate is coupled to the first drain and wherein the second source is coupled to the first gate;

an output coupled to the second drain, wherein the output is configured to receive an output voltage which is amplified relative to a voltage upon said bit line; and a current sourcing pair of transistors connected in series between a power supply and said first drain for supplying current to the first drain during times when the voltage upon the bit line is greater than a threshold voltage of said amplifying transistor.

31. The programmable logic device as recited in claim 30, further comprising a first bias transistor coupled between said first source and a ground supply for drawing current from said first source to said ground supply.

32. The programmable logic device as recited in claim 30, wherein said programmable interconnect devices comprise interconnect transistors.

33. The programmable logic device as recited in claim 32, wherein said plurality of word lines are coupled to a gate of said interconnect transistors.

34. The programmable logic device as recited in claim 32, wherein said interconnect transistors are electrically programmable.

35. The programmable logic device as recited in claim 30, wherein a signal upon said bit line is responsive to a logic state upon said word lines.

36. The programmable logic device as recited in claim 31, wherein said first bias transistor is responsive to a first reference voltage placed upon a gate of the first bias transistor.

37. The programmable logic device as recited in claim 30, further comprising a current channeling transistor having a third gate, a third source and a third drain, wherein the third gate and third drain are mutually connected to said first drain, and wherein the third source is connected to said second drain.

38. The programmable logic device as recited in claim 37, further comprising:

a second bias transistors coupled between said second drain and a power supply for sourcing current from said power supply to said pull-up transistor when voltage upon said bit line is less than a threshold voltage of said amplifying transistor; and a third bias transistor coupled between said first drain and said power supply for sourcing current from said power supply and through said pull-up transistor via said current channeling transistor when voltage upon said bit line is less than a threshold voltage of said amplifying transistor.

39. The programmable logic device as recited in claim 30, further comprising means for directing a first supply of current through said pull-up transistor during a time period when voltage upon said bit line is less than a threshold voltage of said amplifying transistor and means for directing a second supply of current through said amplifying transistor during a time period when voltage upon said bit line is greater than a threshold voltage of said amplifying transistor, and wherein said first supply of current is substantially equal to said second supply of current.

40. A sense amplifier, comprising:

a bit line responsive to at least one programmable device connected thereto;

an amplifying transistor having a first gate, a first source and a first drain, wherein the first gate is coupled to the bit line;

pull-up transistor having a second gate, a second source and a second drain, wherein the second gate is coupled to the first drain, the second source is coupled to the first gate, and the second drain is coupled to an output conductor;

an output voltage applied to the output conductor which is amplified relative to a voltage upon said bit line; and a current source pair of transistors connected in series between a power supply and said first drain for providing constant current.

41. The sense amplifier as recited in claim 40, further comprising a current channeling transistor having a third gate, a third source and a third drain, wherein said third gate and said third drain are mutually connected to said first drain, and said third source is connected to said second drain.

42. The sense amplifier as recited in claim 40, further comprising:

a first bias transistor coupled between a ground supply and the first source; and a second bias transistor coupled between a power supply and the output conductor.

43. The sense amplifier as recited in claim 42, wherein said output voltage is pulled up to approximately said power supply during times when the logic value upon said bit line is at a relatively high value.

44. The sense amplifier as recited in claim 43, wherein said relatively high value comprises a voltage magnitude exceeding a turn-on threshold of said amplifying transistor.

45. The sense amplifier as recited in claim 42, wherein said output voltage is pulled down via pull down transistors coupled to the bit line to approximately said ground supply during times when the logic value upon said bit line is at a relatively low value.

46. The sense amplifier as recited in claim 45, wherein said relatively low value comprises a voltage magnitude less than a turn-on threshold of said amplifying transistor.

47. A programmable logic device, comprising:

an array of programmable interconnect devices arranged in a plurality of rows and columns;

a plurality of word lines connected to a respective one of said plurality of programmable interconnect devices arranged within one of the plurality of columns;

a bit line coupled to said plurality of programmable interconnect devices arranged within said one of the plurality of columns;

an amplifying transistor having a first gate, a first source and a first drain, wherein the first gate is coupled to receive the bit line;

a pull-up transistor having a second gate, a second source and a second drain, wherein the second gate is coupled to the first drain and wherein the second source is coupled to the first gate;

a current channeling transistor having a third gate, a third source and a third drain, wherein the third gate and third drain are mutually connected to said first drain, and wherein the third source is connected to said second drain; and an output coupled to the second drain, wherein the output is configured to receive an output voltage which is amplified relative to a voltage upon said bit line.

48. The programmable logic device as recited in claim 47, further comprising a first bias transistor coupled between said first source and a ground supply for drawing current from said first source to said ground supply.

49. The programmable logic device as recited in claim 47, wherein said programmable interconnect devices comprise interconnect transistors.

50. The programmable logic device as recited in claim 49, wherein said plurality of word lines are coupled to a gate of said interconnect transistors.

51. The programmable logic device as recited in claim 49, wherein said interconnect transistors are electrically programmable.

52. The programmable logic device as recited in claim 47, wherein a signal upon said bit line is responsive to a signal upon said word lines.

53. The programmable logic device as recited in claim 48, wherein said first bias transistor is responsive to a first reference voltage placed upon a gate of the first bias transistor.

54. A sense amplifier, comprising:

a bit line responsive to at least one programmable device connected thereto;

an amplifying transistor having a first gate, a first source and a first drain, wherein the first gate is coupled to the bit line;

a pull-up transistor having a second gate, a second source and a second drain, wherein the second gate is coupled to the first drain, the second source is coupled to the first gate, and the second drain is coupled to an output conductor;

an output voltage applied to the output conductor which is amplified relative to a logic value upon said bit line; and current channeling transistor coupled between the output conductor and the first drain for channeling current through a path formed by the second drain and second source during times when the logic value upon said bit line is less than a turn-on voltage of said amplifying transistor.

55. The sense amplifier as recited in claim 54, wherein said current channeling transistor comprises a third gate, a third source and a third drain, wherein said third gate and said third drain are mutually connected to said first drain, and said third source is connected to said second drain.

56. The sense amplifier as recited in claim 54, further comprising:

a first bias transistor coupled between a ground supply and the first source; and a second bias transistor coupled between a power supply and the output conductor.

57. The sense amplifier as recited in claim 56, wherein said output voltage is pulled up to approximately said power supply during times when the logic value upon said bit line is at a relatively high value.

58. The sense amplifier as recited in claim 57, wherein said relatively high value comprises a voltage magnitude exceeding a turn-on threshold of said amplifying transistor.

59. The sense amplifier as recited in claim 56, wherein said output voltage is pulled down via pull down transistors coupled to the bit line to approximately said ground supply during times when the logic value upon said bit line is at a relatively low value.

60. The sense amplifier as recited in claim 59, wherein said relatively low value comprises a voltage magnitude less than a turn-on threshold of said amplifying transistor.

* * * * *

UNITED STATES PATENT AND TRADEMARK OFFICE
CERTIFICATE OF CORRECTION

PATENT NO. : 5,734,275
DATED : March 31, 1998
INVENTOR(S) : Benjamin Howard Ashmore, Jr.

It is certified that error appears in the above-indentified patent and that said Letters Patent is hereby corrected as shown below:

Claim 1, col. 10, line 8, please insert --a-- before the word "plurality" at the claim element beginning with "plurality of word lines . . . "

Claim 1, col. 10, line 13, please insert --the-- between the words "of" and "plurality".

Claim 26, col. 12, line 27, please insert --a-- before the word "bit" at the claim element beginning with "bit line responsive . . . "

Claim 26, col. 12, line 32, please replace the word "sound" with the word "second".

Claim 26, col. 12, line 39, please insert --a-- before the word "clipping" at the claim element beginning with "clipping diode coupled . . . "

Claim 40, col. 14, line 8, please replace the word "source" with the word "sourcing".

Claim 54, col 15, line 31, please insert --a-- before the word "current" at the claim element beginning with "current channeling transistor . . . "

Signed and Sealed this

Fourteenth Day of July, 1998

Attest:

BRUCE LEHMAN

*Attesting Officer*  *Commissioner of Patents and Trademarks*